United States Patent
Koo

(10) Patent No.: US 7,099,228 B2
(45) Date of Patent: Aug. 29, 2006

(54) SEMICONDUCTOR MEMORY DEVICE

(75) Inventor: Cheul Hee Koo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 73 days.

(21) Appl. No.: 11/004,806

(22) Filed: Dec. 7, 2004

(65) Prior Publication Data

US 2006/0050601 A1    Mar. 9, 2006

(30) Foreign Application Priority Data

Sep. 8, 2004    (KR)    ........................ 10-2004-0071647

(51) Int. Cl.
*G11C 8/00*    (2006.01)
(52) U.S. Cl. .................. 365/230.03; 365/194; 365/233
(58) Field of Classification Search ................ 365/194, 365/233, 230.03
See application file for complete search history.

(56) References Cited

U.S. PATENT DOCUMENTS 6,538,956 B1 * 3/2003 Ryu et al. .................... 365/233
6,671,787 B1 * 12/2003 Kanda et al. ................ 711/167

* cited by examiner

*Primary Examiner*—Hoai V. Ho
(74) *Attorney, Agent, or Firm*—Heller Ehrman LLP

(57) ABSTRACT

A semiconductor memory device processes external commands in parallel using divided clocks, which embodies a high-speed operation of a DRAM in increase of clock frequency. In the semiconductor memory device, command processing blocks are separated into row and column paths in parallel, and the command processing blocks connected in parallel are sequentially latched by clocks obtained by dividing input clocks applied externally, thereby improving the operation speed of the DRAM at high operation and reducing power consumption.

18 Claims, 8 Drawing Sheets

SEMICONDUCTOR MEMORY DEVICE

BACKGROUND ART

1. Field of the Invention

The present invention generally relates to a semiconductor memory device, and more specifically, to a technology of processing external commands in parallel using divided clocks, thereby embodying a high-speed operation of a DRAM in increase of clock frequency.

2. Background of the Prior Art

FIG. 1 is a diagram illustrating a conventional semiconductor memory device.

The conventional semiconductor memory device comprises a clock generator 1, an input buffer 2, a latch unit 3, a command processing block 4, a bank control block 5 and an asynchronous block 6.

The clock generator 1 generates an internal clock CLKP synchronously with respect to a clock CLK applied externally. The input buffer 2 compares a reference voltage Vref with a command signal CMD applied externally, and outputs a signal having a full voltage level to a node ND1.

The latch unit 3 latches an output signal from the node ND1 Synchronously with respect to a first internal clock CLKP applied from the clock generator 1, and outputs the latched output signal to a node ND2. The latch unit 3 Latches data applied to the node ND1 during a pulse width period of the first internal clock CLKP.

The command processing block 4 latches an output signal from the node ND2 synchronously with respect to a second internal clock CLKP, and outputs the latches output signal to a node ND3. The bank control block 5 latches an output signal from the node ND3 synchronously with respect to a third internal clock CLKP, and outputs the latches output signal to the asynchronous block 6. The asynchronous block 6 performs a specific processing by internal sequential asynchronous operation in response to an output signal applied from a node ND4.

The above-described conventional semiconductor memory device uses the externally applied clock CLK or alters the clock CLK to have a predetermined pulse width, thereby controlling internal command processing blocks.

However, if internal command processing blocks use the externally inputted clock CLK as it is when the frequency of the clock CLK increases over 1 GHz at high-speed operation of the conventional semiconductor memory device, the internal command processing blocks do not secure the normal operation.

That is, the data processing time of more than 1 ns is required so that each of the command processing block 4 and the bank control block 5 may perform a normal operation. However, when the frequency of the clock CLK is more than 1 GHz, the data processing time is not sufficient in transmission of a signal latched in the command processing block 4 to the bank control block 5, and the conventional semiconductor memory device do not perform the normal operation.

SUMMARY OF THE INVENTION

Accordingly, it is an object of the present invention to provide a semiconductor memory device which processes external commands in parallel using divided clocks, thereby embodying a high-speed operation of a DRAM in increase of clock frequency.

In an embodiment, a semiconductor memory device comprises a clock generator, a latch unit, a first command processing means, a second command processing means and a selection unit. The clock generator delays an input clock for a predetermined time to generate a delay clock, and divides the input clock to output a first division signal and a second division signal having an opposite phase to that of the first division signal. The latch unit latches an input signal buffered synchronously with respect to the delay clock for a predetermined time. The first command processing means comprising a plurality of command processing blocks connected in parallel latches and amplifies an output signal applied from the latch unit synchronously with respect to the first division signal and the second division signal. The second command processing means comprising a plurality of bank control blocks connected in parallel generates a control signal to control row and column paths in response to an output signal applied from the first command processing means synchronously with respect to the first division signal and the second division signal. The selection unit selects one of output signals from the second command processing means in response to the first division signal and the second division signal.

In another embodiment, a semiconductor memory device comprises a clock generator, a latch unit, a first command processing means, a second command processing means and a selection unit. The clock generator delays an input clock to generate a delay clock and outputs a first division signal and a second division signal having an opposite phase to that of the first division signal. The latch unit latches a input signal buffered synchronously with respect to the delay clock for a predetermined time. The first command processing means processes a predetermined operation command in response to an output signal applied from the latch unit synchronously with respect to the first division signal. The second command processing means processes a predetermined operation command in response to an output signal applied from the latch unit synchronously with respect to the second division signal. The selection unit selects one of output signals from the first command processing means and the second command processing means in response to the first division signal and the second division signal.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
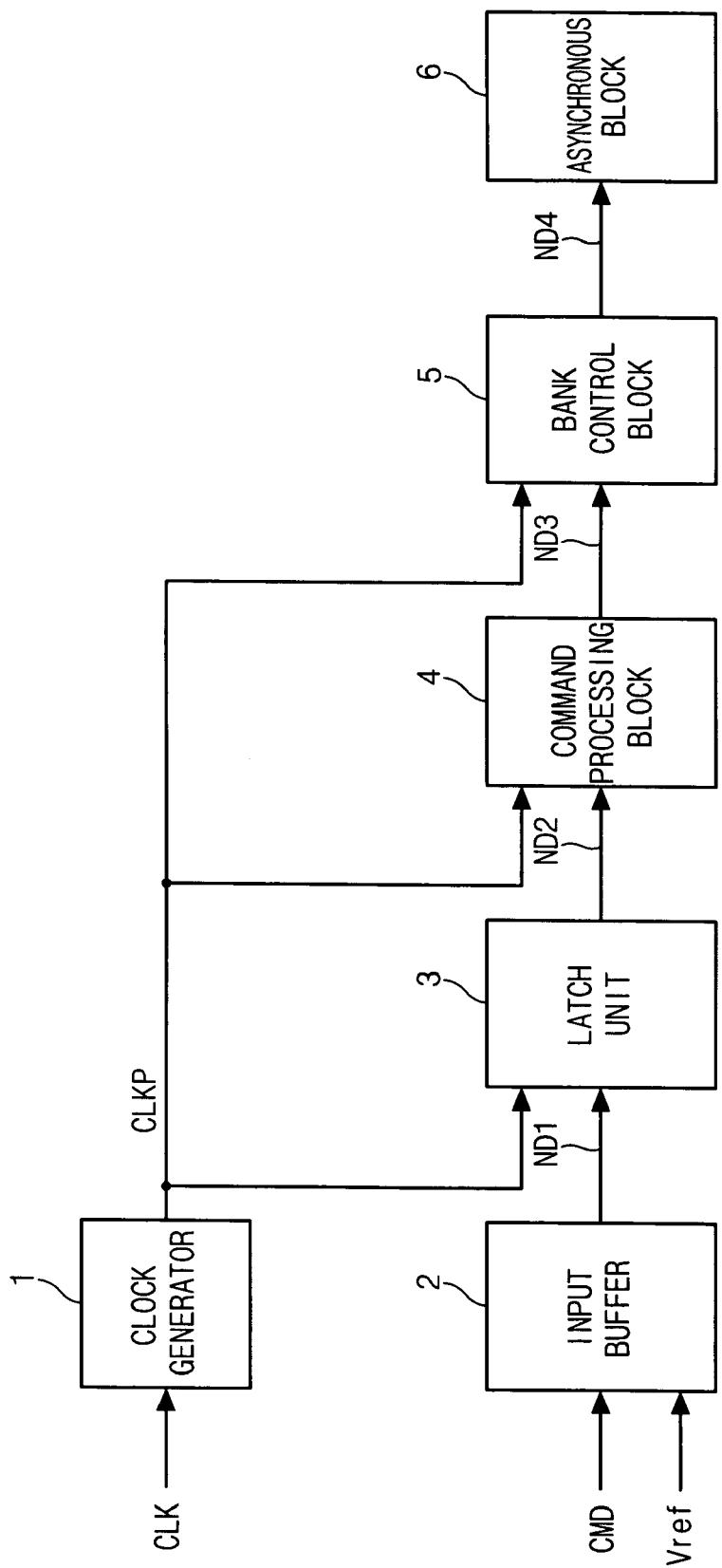
FIG. 1 is a diagram illustrating a conventional semiconductor memory device.
Figure 2:
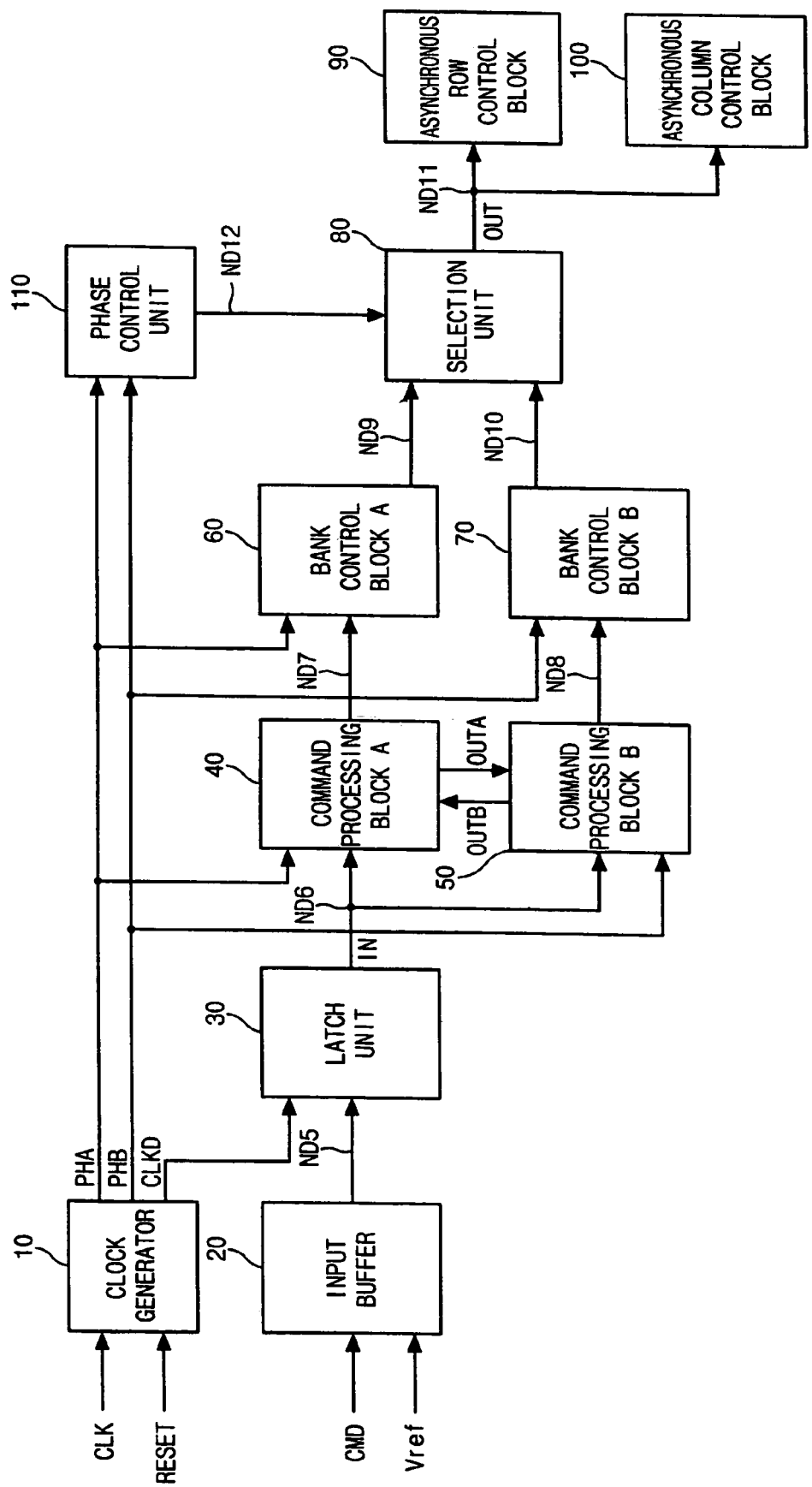
FIG. 2 is a diagram illustrating an example of a semiconductor memory device according to an embodiment of the present invention.

FIG. 2 is a diagram illustrating an example of a semiconductor memory device according to an embodiment of the present invention.

In an embodiment, the semiconductor memory device comprises a clock generator 10, an input buffer 20, a latch unit 30, a command processing block A 40, a command processing block B 50, a bank control block A 60, a bank control block B 70, a selection unit 80, an asynchronous row control block 90, an asynchronous column control block 100 and a phase control unit 110.

Here, the clock generator 10 divides a clock CLK applied externally, and generates a delay clock CLKD obtained by delaying division signals PHA, PHB having an opposite phase to each other and the clock CLK for a predetermined time.

The input buffer 20 compares a reference voltage Vref with a command signal CMD applied externally, and outputs a signal having a full voltage level to a node ND5. Although the input signal inputted in the input buffer 20 is explained as the command signal CMD herein, the input signal applied to the input buffer 20 may be an address signal.

The latch unit 30 latches an output signal from the node ND5 synchronously with respect to the delay clock CLKD applied from the clock generator 10, and outputs the latched signal to a node ND6. The latch unit 30 latches data applied to the node ND5 during a pulse width period of the first delay clock CLKD.

The command processing block A 40 latches an output signal from the node ND6 synchronously with respect to a rising edge of the division signal PHA, and outputs the latched signal to a node ND7 through a random data processing process. The command processing block B 50 latches the output signal from the node ND6 synchronously with respect to a rising edge of the division signal PHB, and outputs the latched signal to a node ND8 through a random data processing process.

The bank control block A 60 latches an output signal from the node ND7 synchronously with respect to the rising edge of the division signal PHA, and outputs the latched signal to a node ND9 through a random data processing process. The bank control block B 70 latches an output signal from the node ND8 synchronously with respect to the rising edge of the division signal PHB, and outputs the latched signal to a node ND10 through a random data processing process.

The selection unit 80 selects one of output signals from the bank control block A 60 or the bank control block B 70 depending on control of the phase control unit 110, and outputs the selected signal to a node ND11. The asynchronous row control block 90 performs an internal sequential asynchronous operation in response to an output signal applied from the node ND11 to control a row path. The asynchronous column control block 100 performs an internal sequential asynchronous operation in response to the output signal applied from the node ND11 to control a column path.

The phase control unit 110 controls phases of the division signals PHA and PHB applied from the clock generator 10, and outputs the signals to the selection unit 80.

Figure 3:
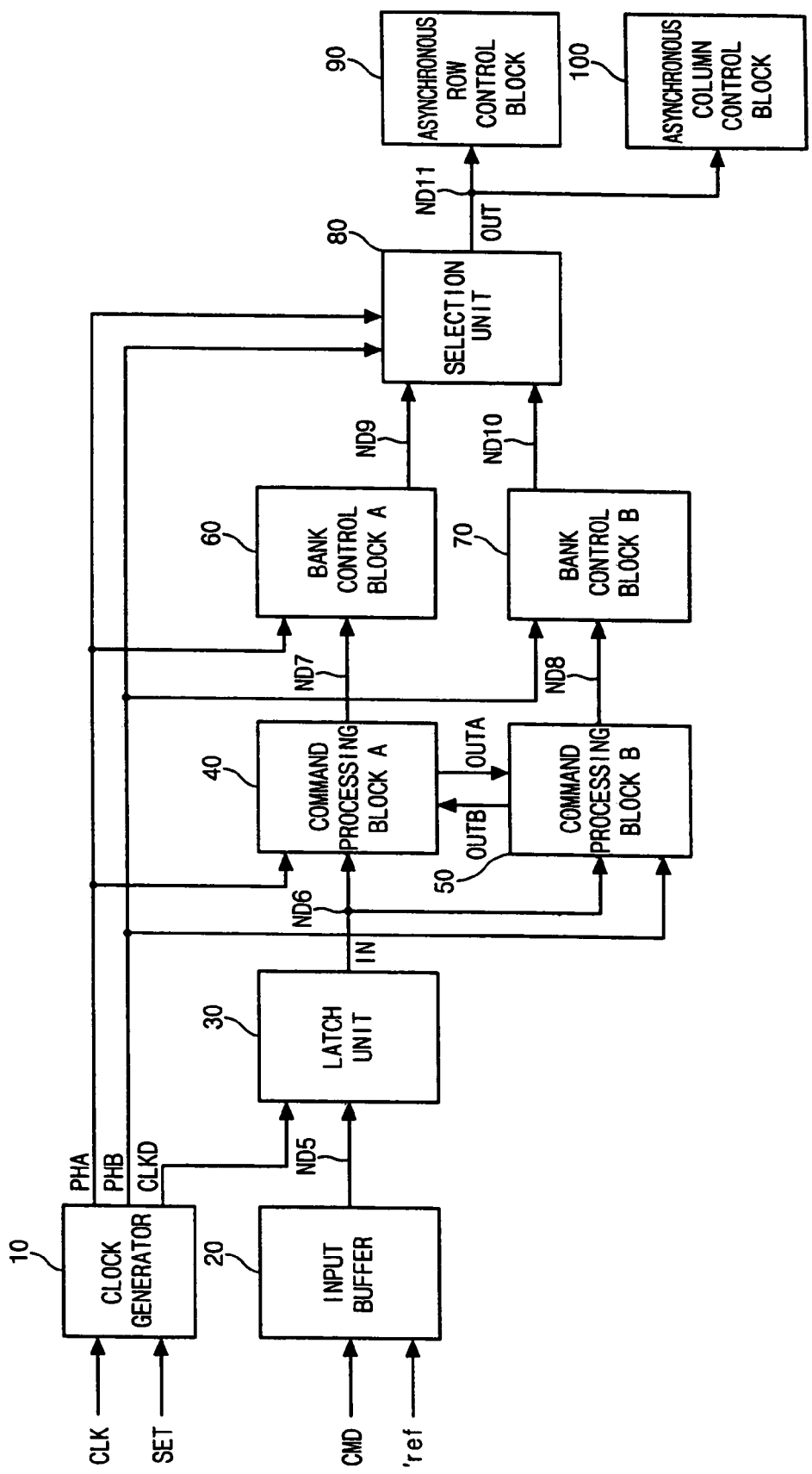
FIG. 3 is a diagram illustrating another example of a semiconductor memory device according to an embodiment of the present invention.

FIG. 3 is a diagram illustrating another example of a semiconductor memory device according to an embodiment of the present invention.

The example of FIG. 3 does not comprise the phase control unit 110 in comparison with that of FIG. 2. Accordingly, the selection unit 80 directly receives the division signals PHA and PHB not through the phase control unit 110. The explanation on the example of FIG. 3 is omitted since the other configuration of FIG. 3 is the same as that of FIG. 2.

The semiconductor memory device according to an embodiment of the present invention may control separated row and column paths since the command processing blocks A 40 and B 50 and the bank control blocks A 60 and B 70 are connected in parallel, respectively.

That is, when a row command signal is inputted, the row path is controlled through the command processing block A 40 and B 50 connected in parallel and the bank control blocks A 60 and B 70 connected in parallel. On the other hand, when a column command signal is inputted, the column path is controlled through the command processing blocks A 40 and B 50 connected in parallel and the bank control blocks A 60 and B 70 connected in parallel.

Figure 4:
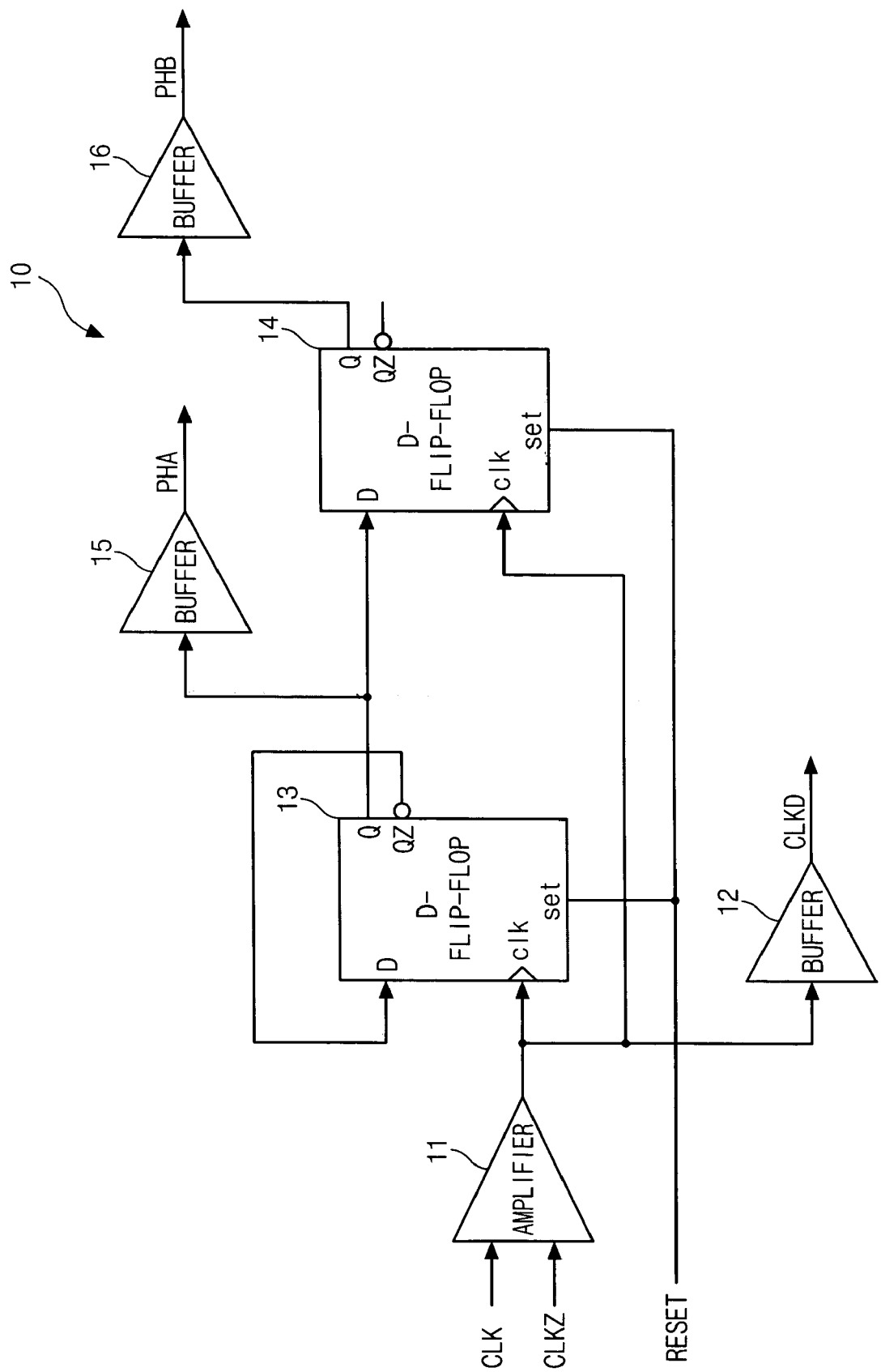
FIG. 4 is a detailed diagram illustrating a clock generator of FIGS. 2 and 3.

FIG. 4 is a detailed diagram illustrating the clock generator 10 of FIGS. 2 and 3.

The clock generator 10 comprises an amplifier 11, buffers 12, 15 and 16, and D-flip-flops 13 and 14.

The amplifier 11 amplifies clocks CLK and CLKZ applied externally. The buffer 12 buffers an output signal from the amplifier 11 to output the delay clock CLKD.

The D-flip-flop 13 flip-flops an input signal synchronously with respect to the clock CLK outputted from the amplifier 11, and divides the cycle of the input signal.

The D-flip-flop 14 flip-flops an input signal synchronously with respect to the clock CLK outputted from the amplifier 11, and divides the cycle of the input signal into ½. Here, the D-flip-flops 13 and 14 are initialized when a reset signal RESET is applied.

The buffer 15 buffers an output signal from the D-flip-flop 13, and outputs the division signal PHA. The buffer 16 buffers an output signal from the D-flip-flop 14, and outputs the division signal PHB.

Figure 5:
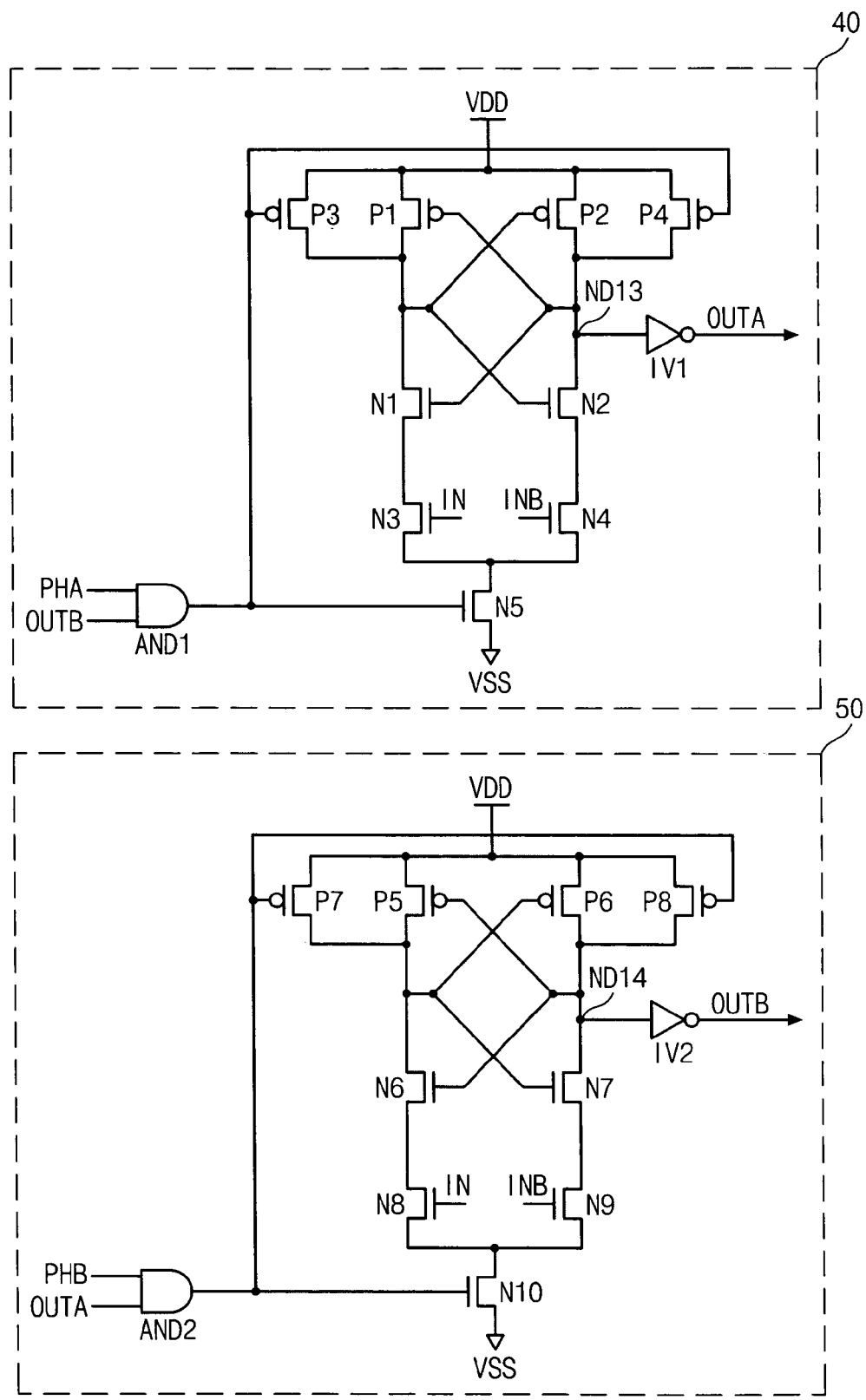
FIG. 5 is a detailed circuit diagram illustrating command processing blocks of FIGS. 2 and 3.

FIG. 5 is a detailed circuit diagram illustrating the command processing blocks A 40 and B 50 of FIGS. 2 and 3.

The command processing block A 40 comprises an AND gate AND1, PMOS transistors P1~P4, NMOS transistors N1~N5, and an inerter IV1.

Here, the AND gate AND1 performs an AND operation on the division signal PHA and an output signal OUTB applied from the command processing block B 50. When the division signal PHA and the output signal OUTB are inputted all at a high level to turn on the NMOS transistor N5, the command processing block A 40 latches and amplifies output signals IN and INB from the latch unit 30.

The command processing block B 50 comprises an AND gate AND2, PMOS transistors P5~P8, NMOS transistors N6~N10, and an inverter IV2.

The AND gate AND2 performs an AND operation on the division signal PHB and an output signal OUTA applied from the command processing block A 40. When the division signal PHB and the output signal OUTA are inputted all at a high level to turn on the NMOS transistor N10, the command processing block B 50 latches and amplifies output signals IN and INB from the latch unit 30.

In the embodiment according to the present invention, the command processing block A 40 receives the output signal OUTB from the command processing block B 50, and the command processing block B 50 receives the output signal OUTA from the command processing block A 40.

As a result, when the command processing block A 40 is operated, the output signal OUTA from the command processing block A 40 becomes 'low'. Here, since the output signal OUTA at the low level is inputted to the AND gate AND2 of the command processing block B 50, the command processing block B 50 is not operated before input of the next clock.

On the other hand, when the command processing block B 50 is operated, the output signal OUTB from the command processing block B 50 becomes 'low'. Here, since the output signal OUTB at the low level is inputted to the AND gate AND1 of the command processing block A 40, the command processing block B 50 is not operated before input of the next clock.

When data are latched by the external clock CLK, glitches generated by overlap of the clocks divided between the command processing block A 40 and the command processing block B 50 are prevented.

Figure 6:
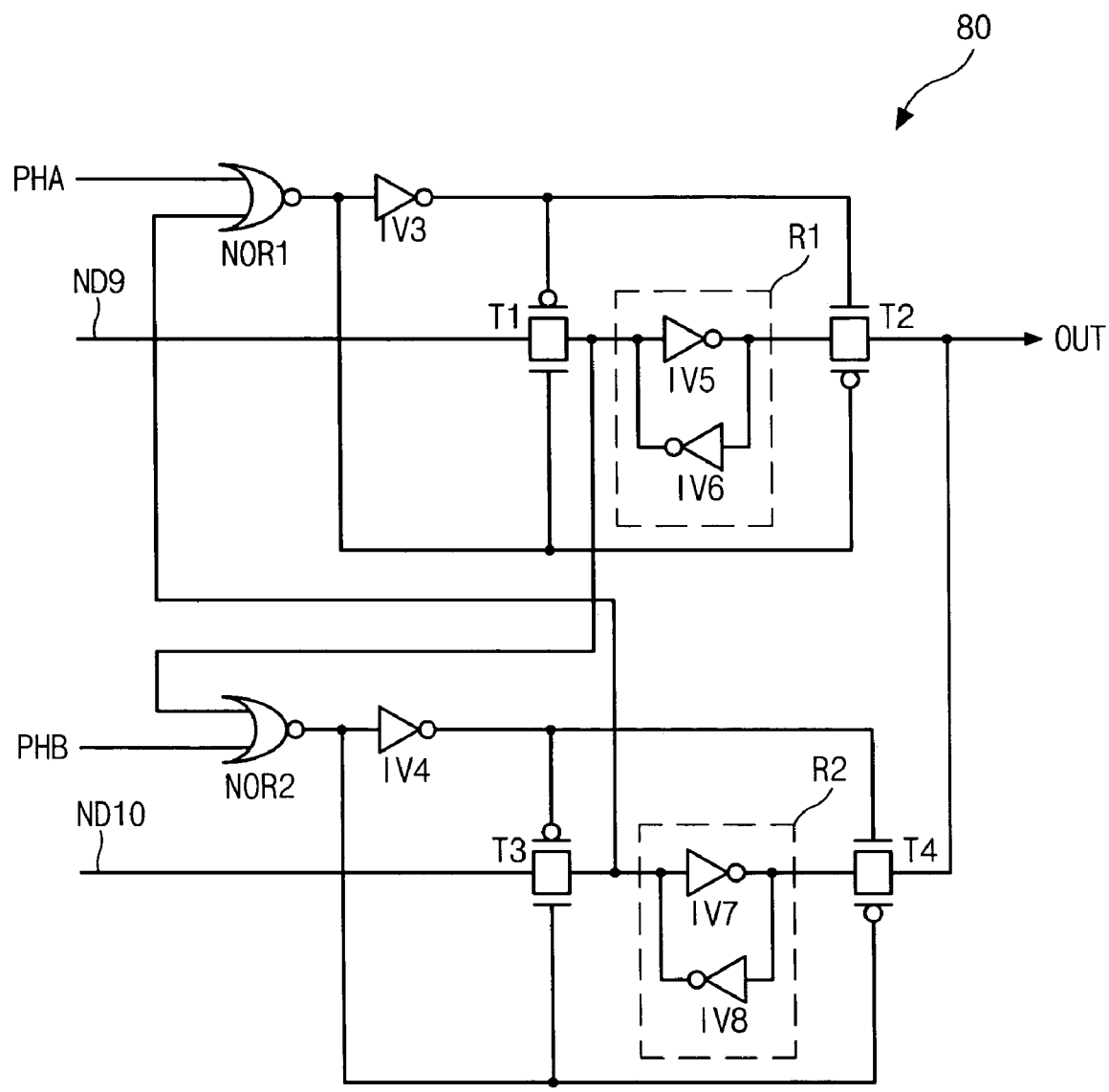
FIG. 6 is a detailed circuit diagram illustrating a selection unit of FIGS. 2 and 3.

FIG. 6 is a detailed circuit diagram illustrating the selection unit 80 of FIGS. 2 and 3.

The selection unit 80 comprises NOR gates NOR1 and NOR2, inverters IV3 and IV4, transmission gates T1~T4, and latches R1 and R2.

The NOR gate NOR1 performs a NOR operation on the division signal PHA and an output signal from the transmission gate T3. The inverter IV3 inverts an output signal from the NOR gate NOR1. The transmission gate T1 selectively outputs a signal applied from the bank control block A 60 depending on an output state of the NOR gate NOR1. The latch R1 which comprises inverters IV5 and IV6 latches the output signal from the transmission gate T1 for a predetermined time. The transmission gate T2 selectively outputs a signal applied from the latch R1 depending on the output state of the NOR gate NOR1.

The NOR gate NOR2 performs a NOR operation on the division signal PHB and the output signal from the transmission gate T1. The inverter IV4 inverts an output signal from the NOR gate NOR2. The transmission gate T3 selectively outputs a signal applied from the bank control block B 70 depending on an output state of the NOR gate NOR2. The latch R2 which comprises inverters IV7 and IV8 latches an output signal from the transmission gate T3 for a predetermined time. The transmission gate T4 selectively outputs a signal applied from the latch R2 depending on the output state of the NOR gate NOR2.

The selection unit 80, which is preferably comprised of a multiplexer, outputs a signal having a pulse width of 1 cycle*0.8 in response to the division signals PHA, PHB and the signals applied from the bank control blocks A 60 and B 70.

Figure 7:
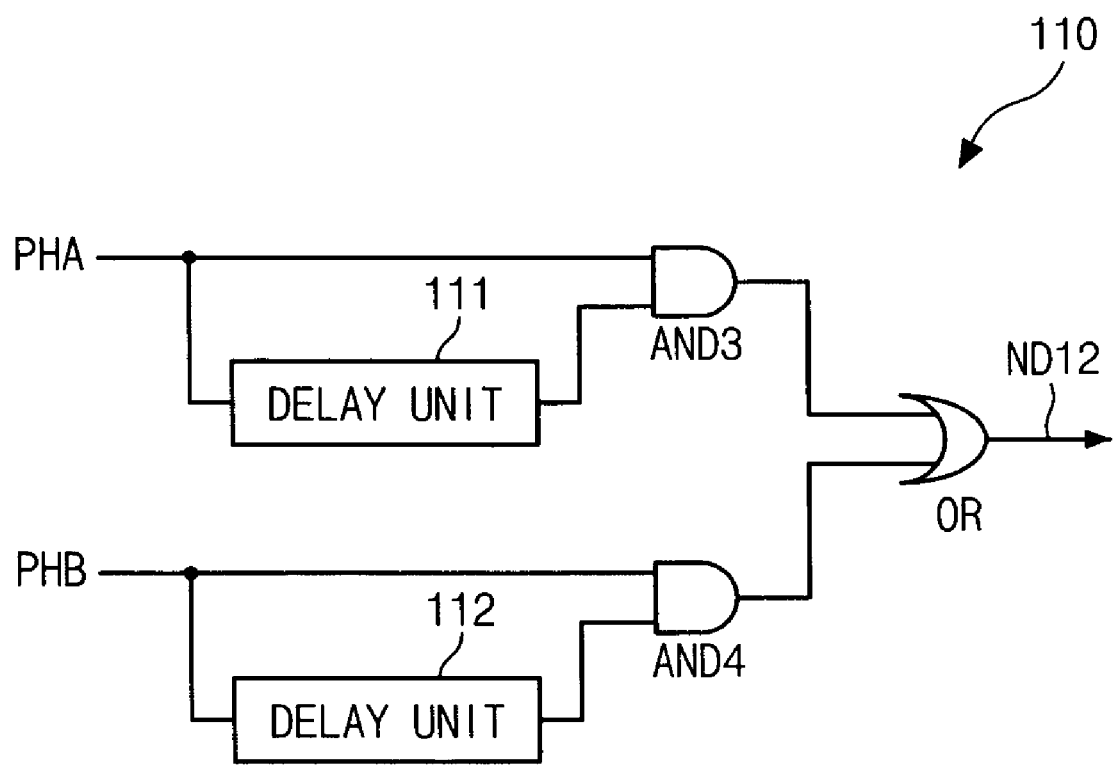
FIG. 7 is a detailed circuit diagram illustrating a phase control unit of FIG. 2.

FIG. 7 is a detailed circuit diagram illustrating the phase control unit 110 of FIG. 2.

The phase control unit 110 comprises delay unit 111 and 112, AND gates AND3 and AND4, an OR gate OR.

The delay unit 111 delays the division signal PHA for a predetermined time. The AND gate AND3 performs an AND operation on the division signal PHA and an output signal from the delay unit 111. The delay unit 112 delays the division signal PHB for a predetermined time. The AND gate AND4 performs an AND operation on the division signal PHB and an output signal from the delay unit 112. The OR gate OR performs an OR operation on output signals from the AND gates AND3 and AND4 to output a signal the selection unit 80.

Here, since the phase control unit 110 outputs the signals obtaining by performing the OR operation on the division signals PHA and PHB in the OR gate OR, an overlap period of the division signals PHA and PHB is not generated.

When the phase control unit 110 is omitted as shown in the example of FIG. 3, there may be an overlap period of the division signals PHA and PHB. However, although there is the overlap period of the division signals PHA and PHB, the normal operation can be performed unless successive row and column commands are inputted in the operation of the DRAM.

Figure 8:
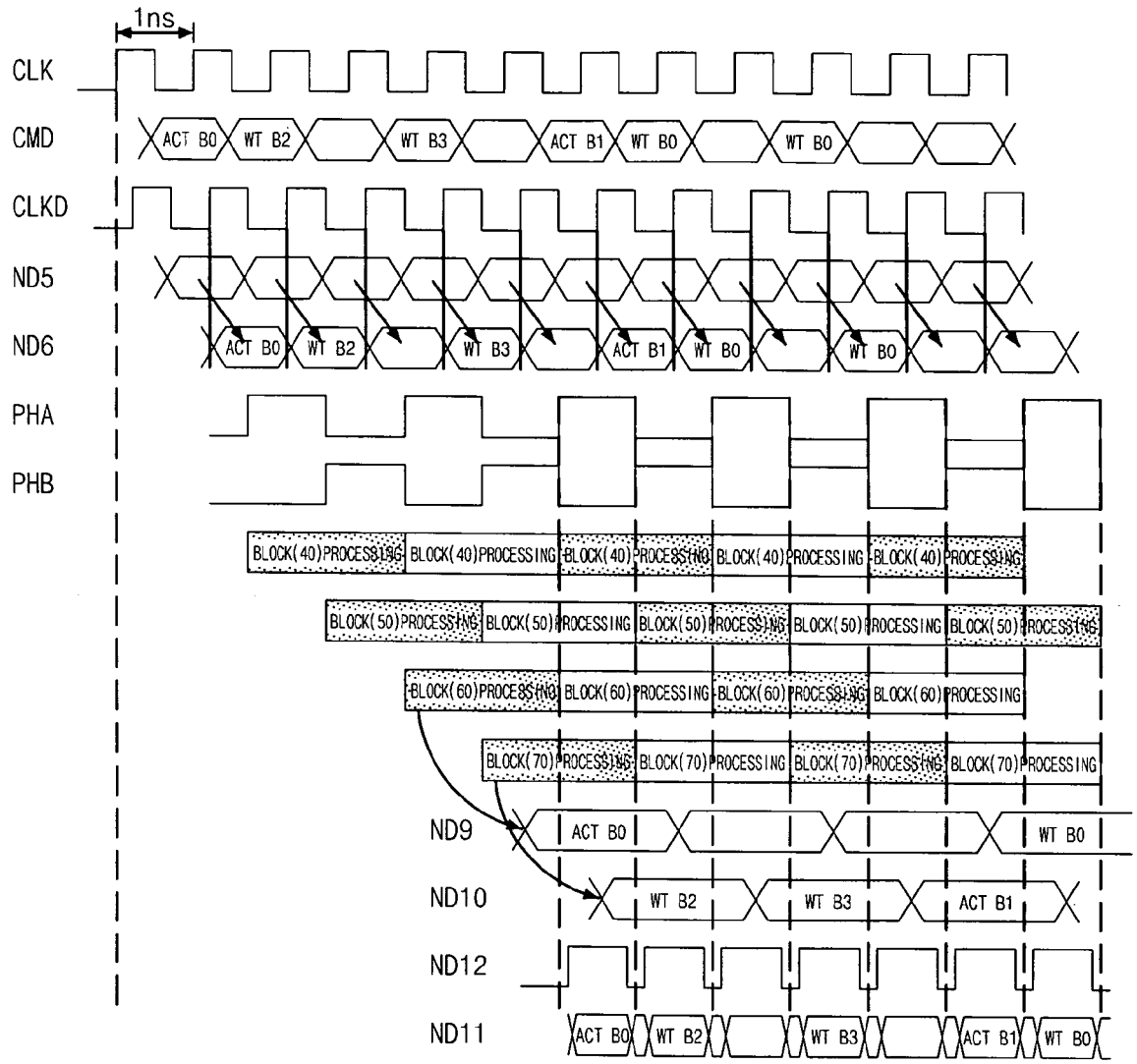
FIG. 8 is a timing diagram illustrating the operation of the semiconductor memory device according to an embodiment of the present invention.

FIG. 8 is a timing diagram illustrating the operation of the semiconductor memory device according to an embodiment of the present invention.

An active command ACT B0 and a write command WT B2 that are aligned at the rising edge of the clock CLK are successively inputted. The clock generator 10 delays the clock CLK for a predetermined time to generate the delay clock CLKD, and divides the delay clock CLKD to generate the division signals PHA and PHB.

The input buffer 20 compares the inputted command signal CMD with the reference voltage Vref to buffer and output the comparison result to the latch unit 30. The latch unit 30 latches the signal applied from the input buffer 20 synchronously with respect to the delay clock CLKD for a predetermined time.

Thereafter, the command processing block A 40 latches the signal applied from the latch unit 30 for a predetermined time synchronously with respect to the division signal PHA, and performs a random data processing process during a cycle of the division signal PHA. The command processing block B 50 latches the signal applied from the latch unit 30 for a predetermined time synchronously with respect to the division signal PHB having an opposite phase to that of the division signal PHA, and performs a random data processing process during a cycle of the division signal PHB.

Preferably, the command processing blocks A 40 and B 50 is comprised of a latch amplifier for latching and amplifying the output signal from the latch unit 30 for a predetermined time. Here, the above-described random data processing process corresponds to a latch amplification process for synchronously controlling row and column paths. Also, the number of row paths can be configured to be same as that of banks.

Thereafter, the bank control block A 60 latches the signal applied from the command processing block A 40 during the next cycle of the division signal PHA, and outputs the latched signal to the node ND9. The bank control block B 70 latches the signal applied from the command processing block B 50 during the next cycle of the division signal PHB, and outputs the latched signal to the node ND10.

Here, the bank control blocks A 60 and B 70 generates bank control signals in response to the signals applied from the command processing blocks A 40 and B 50 for control of the row or column paths.

The phase control unit 110 outputs a control signal for selecting one of the output signals from the nodes ND9 and ND10 synchronously with respect to the division signals PHA and PHB to the selection unit 80. Then, the selection unit 80 outputs the active command ACT B0, the write command WT B2, a write command WT B3, an active command ACT B1 and a write command WT B0 sequentially to the asynchronous row control block 90 and the asynchronous column control block 100 in response to the control signal applied from the phase control unit 110.

Here, the selection unit 80 selects only one of the output signals from the bank control blocks A 60 and B 70 in response to the control signal applied from the phase control unit 110.

Thereafter, the asynchronous row control block 90 performs an asynchronous row command in response to the signal OUT applied from the selection unit 80. The asynchronous column control block 100 performs an asynchronous column command in response to the signal OUT applied from the selection unit 80.

In tRRD (more than 2 tck) and tCCD (2 tck) spec which define a core operation of the DRAM according to the embodiment of the present invention, the actual frequency of the core operation of the row and column commands is limited below 500 MHz. As a result, when successive command signals of high frequency (more than 1 GHz) are applied to the DRAM, external input signals are processed in parallel to perform the normal core operation of the DRAM.

As discussed earlier, in a semiconductor memory device according to an embodiment of the present invention, the operation speed of the DRAM is improved in increase of clock frequency by processing external commands in parallel with divided clocks, and also power consumption due to high-speed operation is reduced.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A semiconductor memory device comprising:
   a clock generator for delaying an input clock for a predetermined time to generate a delay clock, and dividing the input clock to output a first division signal and a second division signal having an opposite phase to that of the first division signal;
   a latch unit for latching an input signal buffered synchronously with respect to the delay clock for a predetermined time;
   a first command processing means comprising a plurality of command processing blocks connected in parallel for latching and amplifying an output signal applied from the latch unit synchronously with respect to the first division signal and the second division signal;
   a second command processing means comprising a plurality of bank control blocks connected in parallel for generating a control signal to control row and column paths in response to an output signal applied from the first command processing means synchronously with respect to the first division signal and the second division signal; and
   a selection unit for selecting one of output signals from the second command processing means in response to the first division signal and the second division signal.

2. The semiconductor memory device according to claim 1, further comprising:
   an input buffer for comparing an input signal with a reference voltage to output the buffered input signal; and
   a phase control unit for controlling phases of the first division signal and the second division signal to output a control signal for controlling the selection of the selection unit.

3. The semiconductor memory device according to claim 2, wherein the phase control unit comprises:
   a first delay unit for delaying the first division signal for a predetermined time;
   a first AND gate for performing an AND operation on the first division signal and an output signal from the first delay unit;
   a second delay unit for delaying the second division signal for a predetermined time;
   a second AND gate for performing an AND operation on the second division signal and an output signal from the second delay unit; and
   an OR gate for performing an OR operation on output signals from the first AND gate and the second AND gate.

4. The semiconductor memory device according to claim 1, wherein the first command processing means comprises:
   a first command processing block for latching and amplifying an output signal applied from the latch unit synchronously with respect to the first division signal to output a first output signal; and
   a second command processing block for latching and amplifying an output signal applied from the latch unit synchronously with respect to the second division signal to output a second output signal.

5. The semiconductor memory device according to claim 4, wherein the first command processing block receives the second output signal and the second command processing block receives the first output signal in order to operate only one of the first command processing block and the second processing block.

6. The semiconductor memory device according to claim 5, wherein the first command processing block comprises a first latch amplification unit for latching and amplifying an output signal from the latch unit to disable the first output signal when the first division signal and the second output signal are all enabled.

7. The semiconductor memory device according to claim 6, wherein the second command processing block comprises a second latch amplification unit for latching and amplifying an output signal from the latch unit to disable the second output signal when the second division signal and the first output signal are all enabled.

8. The semiconductor memory device according to claim 1, wherein the second command processing means comprises:
   a first bank control block for outputting a control signal to control row and column paths in response to an output signal from the first command processing means synchronously with respect to the first division signal; and
   a second bank control block for outputting a control signal to control row and column paths in response to an output signal from the first command processing means synchronously with respect to the second division signal.

9. The semiconductor memory device according to claim 1, wherein the clock generator comprises:
   an amplifier for amplifying and buffering the input clock to output the delay clock;
   a flip-flop unit for dividing the delay clock synchronously with respect to an output clock of the amplifier; and
   a buffer unit for buffering an output signal from the flip-flop unit to output the first division signal and the second division signal.

10. The semiconductor memory device according to claim 1, wherein the selection unit comprises:
    a first selection unit for selecting a second output signal applied from the second command processing means in response to the first division signal and a first output signal from the second processing means; and a second selection unit for selecting the first output signal applied from the second command processing means in response to the second division signal and a second output signal from the second command processing means.

11. The semiconductor memory device according to claim 10, wherein the first selection unit comprises:
   a first logic unit for performing a logic operation on the first division signal and the first output signal;
   a first transmission gate for selectively controlling output of the second output signal depending on an output state of the first logic unit;
   a first latch unit for latching an output signal from the first transmission gate; and
   a second transmission gate for selectively controlling an output signal from the first latch unit depending on an output state of the first logic unit.

12. The semiconductor memory device according to claim 10, wherein the second selection unit comprises:
   a second logic unit for performing a logic operation on the second division signal and the second output signal;
   a third transmission gate for selectively controlling output of the first output signal depending on an output state of the second logic unit;
   a second latch unit for latching an output signal from the third transmission gate; and
   a fourth transmission gate for selectively controlling an output signal from the second latch unit depending on an output state of the second logic unit.

13. The semiconductor memory device according to claim 1, further comprising:
   an asynchronous row control block for performing an asynchronous row command in response to an output signal from the selection unit; and
   an asynchronous column control block for performing an asynchronous column command in response to an output signal from the selection unit.

14. A semiconductor memory device comprising:
   a clock generator for delaying an input clock for a predetermined time to generate a delay clock, and dividing the input clock to output a first division signal and a second division signal having an opposite phase to that of the first division signal;
   a latch unit for latching a input signal buffered synchronously with respect to the delay clock for a predetermined time;
   a first command processing means for processing a predetermined operation command in response to an output signal applied from the latch unit synchronously with respect to the first division signal;
   a second command processing means for processing a predetermined operation command in response to an output signal applied from the latch unit synchronously with respect to the second division signal; and
   a selection unit for selecting one of output signals from the first command processing means and the second command processing means in response to the first division signal and the second division signal.

15. The semiconductor memory device according to claim 14, wherein the first command processing means receives an output signal from the second command processing means and the second command processing means receives an output signal from the first command processing means in order to operate only one of the first command processing means and the second processing means.

16. The semiconductor memory device according to claim 14, further comprising:
   an input buffer for comparing an input signal with a reference voltage to output the buffered input signal having a full voltage level; and
   a phase control unit for controlling phases of the first division signal and the second division signal to output a control signal for controlling selection of the selection unit.

17. The semiconductor memory device according to claim 14, wherein the first command processing means comprises:
   a first command processing block for latching and amplifying an output signal applied from the latch unit synchronously with respect to the first division signal; and
   a first bank control block for outputting a bank control signal to control row and column paths in response to an output signal from the first command processing block synchronously with respect to the first division signal.

18. The semiconductor memory device according to claim 14, wherein the second command processing means comprises:
   a second command processing block for latching and amplifying an output signal applied from the latch unit synchronously with respect to the second division signal; and
   a second bank control block for outputting a bank control signal to control row and column paths in response to an output signal from the second command processing block synchronously with respect to the second division signal.

* * * * *